United States Patent
Shibusawa et al.

(10) Patent No.: US 9,828,671 B2
(45) Date of Patent: *Nov. 28, 2017

(54) METHOD FOR FIXATION ONTO LAYER COMPRISING AMORPHOUS CARBON FILM, AND LAMINATE

(71) Applicant: Taiyo Yuden Chemical Technology Co., Ltd., Takasaki-shi, Gunma (JP)

(72) Inventors: Kunihiko Shibusawa, Takasaki (JP); Takeshi Sato, Takasaki (JP)

(73) Assignee: TAIYO YUDEN CHEMICAL TECHNOLOGY CO., LTD., Gunma (JP)

(*) Notice: Subject to any disclaimer, the term of this patent is extended or adjusted under 35 U.S.C. 154(b) by 167 days.

This patent is subject to a terminal disclaimer.

(21) Appl. No.: 14/819,556

(22) Filed: Aug. 6, 2015

(65) Prior Publication Data

US 2015/0376779 A1 Dec. 31, 2015

Related U.S. Application Data

(63) Continuation of application No. 13/582,731, filed as application No. PCT/JP2011/054861 on Mar. 3, 2011, now Pat. No. 9,132,609.

(30) Foreign Application Priority Data

Mar. 3, 2010 (JP) .................................. 2010-047194

(51) Int. Cl.
*B32B 9/00* (2006.01)
*C23C 16/26* (2006.01)
(Continued)

(52) U.S. Cl.
CPC ................ *C23C 16/26* (2013.01); *B32B 9/04* (2013.01); *B32B 37/16* (2013.01); *C01B 32/05* (2017.08); *Y10T 156/10* (2015.01); *Y10T 428/30* (2015.01)

(58) Field of Classification Search
None
See application file for complete search history.

(56) References Cited

U.S. PATENT DOCUMENTS 4,777,090 A  10/1988  Ovshinsky et al.
5,437,894 A  8/1995  Ogawa et al.
(Continued)

FOREIGN PATENT DOCUMENTS

DE  102008022039  * 11/2009  ......... C23C 14/0605
EP  1 754 684 A1  2/2007
(Continued)

OTHER PUBLICATIONS

Choi et al., "Self-assembled monolayer on diamond-like carbon surface: formation and friction measurements", 2003, Tribology International, vol. 36, pp. 285-290.*

(Continued)

*Primary Examiner* — Seth Dumbris
(74) *Attorney, Agent, or Firm* — Pillsbury Winthrop Shaw Pittman, LLP

(57) ABSTRACT

A method for fixation, onto a layer comprising an amorphous carbon film and provided on a base material, of a layer comprising a material condensation-reacting with hydroxyl groups on a surface of the amorphous carbon film, whereby, in the layer comprising an amorphous carbon film and provided on the base material, the amorphous carbon film can have a holding power which is strong enough to fix the layer comprising a material condensation-reacting with a hydroxyl group on the surface of the amorphous carbon film (Continued)

and can have uniformity of the holding power. Si and O are added into the layer comprising an amorphous carbon film to thereby improve adhesion durability and binding uniformity of the layer comprising a material condensation-reacting with a hydroxyl group. Particularly, by using a fluorine-based silane coupling agent, it is possible to impart high functions such as water repellency/oil repellency, abrasion resistance, chemical resistance, low friction properties and non-tackiness to the amorphous carbon film.

6 Claims, 6 Drawing Sheets

(51) Int. Cl.
  *B32B 9/04* (2006.01)
  *B32B 37/16* (2006.01)
  *C01B 32/05* (2017.01)

(56) References Cited

U.S. PATENT DOCUMENTS

| | | | |
|---|---|---|---|
| 5,466,431 A | 11/1995 | Dorfman et al. | |
| 6,200,675 B1 | 3/2001 | Neerinck et al. | |
| 6,277,480 B1* | 8/2001 | Veerasamy | B05D 5/083 428/212 |
| 6,280,834 B1* | 8/2001 | Veerasamy | B05D 5/083 428/212 |
| 6,284,377 B1* | 9/2001 | Veerasamy | B05D 5/083 428/336 |
| 6,312,808 B1* | 11/2001 | Veerasamy | B05D 5/083 428/217 |
| 7,820,293 B2 | 10/2010 | Dekempeneer | |
| 8,557,714 B2 | 10/2013 | Kikuchi | |
| 2002/0028289 A1 | 3/2002 | Veerasamy | |
| 2004/0038033 A1* | 2/2004 | Massler | C23C 16/029 428/408 |
| 2006/0210833 A1 | 9/2006 | Saito et al. | |
| 2006/0257663 A1 | 11/2006 | Doll et al. | |
| 2008/0233425 A1* | 9/2008 | Dekempeneer | C23C 28/044 428/634 |
| 2010/0304014 A1 | 12/2010 | Ishikawa | |

FOREIGN PATENT DOCUMENTS

| | | |
|---|---|---|
| JP | 04-336258 | 11/1992 |
| JP | 2001-111077 | 4/2001 |
| JP | 2001-195729 | 7/2001 |
| JP | 2005-146060 | 6/2005 |
| JP | 2006-291355 | 10/2006 |
| JP | 2008-143098 | 6/2008 |
| JP | 2008-155437 | 7/2008 |
| JP | 2008-185124 | 8/2008 |
| JP | 2008-232877 | 10/2008 |
| JP | 2010-067637 | 3/2010 |
| WO | WO 2011/108625 | 9/2011 |

OTHER PUBLICATIONS

Lambert et al., "Organic Structural Spectroscopy", 1998, Prentice-Hall, pp. 192, 194-195, and 238.*
Japanese Office Action dated Oct. 11, 2016 for Application No. 2015-190194.
Korean Office Action dated Jul. 22, 2014 for Appln. No. 10-2012-7022573.
Chinese Office Action dated Nov. 15, 2014 for Appln. No. 201180012024.3.
Japanese Office Action dated Mar. 3, 2015 for Appln. No. 2014-101053.
Intl Preliminary Report on Patentability dated Oct. 2, 2012 of PCT/JP2011/054861 filed Mar. 3, 2011.
Korean Office Action dated Dec. 12, 2013 for Korean Patent Application No. 2012-7022573.
Taiwanese Office Action dated Feb. 21, 2014 of Taiwanese Patent Application No. 100107237.
Japanese Office Action dated Mar. 18, 2014 of Japanese Patent Application No. 2012-503231.
Chinese Office Action dated Mar. 26, 2014 of Chinese Patent Application No. 201180012024.3.
Extended European Search Report dated Jun. 3, 2016 for European Patent Application No. 11750734.3.

* cited by examiner

METHOD FOR FIXATION ONTO LAYER COMPRISING AMORPHOUS CARBON FILM, AND LAMINATE

CROSS-REFERENCE TO RELATED APPLICATIONS

This application is a continuation of U.S. application Ser. No. 13/582,731, filed Dec. 13, 2012, which is a U.S. National Stage application under 35 USC §371 of PCT/JP2011/054861 filed Mar. 3, 2011, which claims priority under the Paris Convention to Japanese Application No. JP2010-047194 filed Mar. 3, 2010. The entire contents of all applications are incorporated herein by reference in their entireties.

TECHNICAL FIELD

The present invention relates to a method for fixation, onto a layer comprising an amorphous carbon film and provided on a base material, of a layer comprising a material condensation-reacting with hydroxyl groups on the surface of the film, and a laminate formed by the method, and particularly relates to a method for fixation, onto a layer comprising an amorphous carbon film, of a layer comprising a water repellent material or a water repellent/oil repellent material, and a laminate formed by the method.

BACKGROUND ART

A diamond-like carbon film (hereinafter, called "amorphous carbon film") is a film excellent in abrasion resistance and slidability and having high strength. For this reason, the amorphous carbon films are used in various fields, including protective films of various devices such as cutting tools and dies. Also, it has been known that a second layer is provided on an amorphous carbon film to make it possible to improve the heat resistance, oxidation resistance, abrasion resistance, lubricity and the like. For these characteristics, amorphous carbon films are expected to be used in a wide variety of fields.

However, there is a problem in that the adhesion between an amorphous carbon film and a second layer is insufficient. As a method of improving the adhesion between the amorphous carbon film and the second layer, there has been known a method of using, for a second layer to be provided on an amorphous carbon film, a material condensation-reacting with hydroxyl groups on the surface of the amorphous carbon film, such as a silane coupling agent. Silanol groups generated by hydrolysis of a silane coupling agent are formed into a polymer by self-condensation and are condensation-reactable with hydroxyl groups on the surface of an amorphous carbon film.

Amorphous carbon films need to be provided with uniform water repellent power or oil repellent power, on their surfaces.

When water repellency is imparted to an amorphous carbon film, there have been known techniques of modifying the surface of the amorphous carbon film with fluorine, for example, by a method of using a gas containing fluorine as a raw material gas during film formation, or a method of subjecting an amorphous carbon film to a surface treatment using a gas containing fluorine after film formation of the amorphous carbon film. However, depending on the degree of addition amount of fluorine, the hardness of the film greatly decreases. In addition, it is unfavorable to use fluorine-based gases which adversely affect film formation devices and human bodies/environments. To solve this problem, methods of introducing fluorine into a surface of an amorphous carbon film without using a fluorine-based gas have been studied. For example, Patent Literature 1 discloses that a surface treatment agent containing an ultrastable perfluoroalkyl radical is used as an active component in surfaces of amorphous carbon films prepared on surfaces of a variety of solid materials, without using fluorine gases, thereby introducing fluorine into the surfaces of the amorphous carbon films.

Further, to improve the adhesion between an amorphous carbon film and a second layer to be provided on the amorphous carbon film, there have also been proposed methods of improving adhesive force of an amorphous carbon film itself. For example, Patent Literature 2 describes that a first layer comprising an amorphous carbon film containing Si excellently adheres to a second layer comprising a polyamideimide layer containing MoS2. In addition, Patent Literature 3 discloses that it is possible to obtain a biomolecular fixation material having stable fixability by using an amorphous carbonaceous film containing Si, without recourse to a chemical modification treatment.

CITATION LIST

Patent Literature

Patent Literature 1: Japanese Patent Laid-Open No. 2005-146060
Patent Literature 2: Japanese Patent Laid-Open No. 2008-185124
Patent Literature 3: Japanese Patent Laid-Open No. 2008-232877

SUMMARY OF INVENTION

Technical Problem

However, it turned out that even when a solution of a silane coupling agent modified with fluorine is applied to an amorphous carbon film, the amorphous carbon film cannot effectively and uniformly hold the silane coupling agent.

Then, it is conceivable that as described in Patent Literatures 2 and 3, by adding Si element to an amorphous carbon film, the holding power of the amorphous carbon film itself can be improved. That is, Patent Literatures 2 and 3 suggest that with respect to the adhesion of the amorphous carbon film containing Si, silanol groups generated by bonding Si (silicon element) in the film to hydroxyl groups are present on the film surface. However, the present inventors examined such an amorphous carbon film, and it turned out that the holding power of the obtained amorphous carbon film to a silane coupling agent was not yet sufficient.

According to various embodiments of the present invention, improvements are provided to a method for fixation, onto an amorphous carbon film provided on a base material, of a layer comprising a material condensation-reacting with hydroxyl groups on the surface of the film.

Solution to Problem

Then, the present inventors carried out extensive studies and examinations to achieve the above object and have found that by further adding oxygen to the amorphous carbon film containing Si, the amorphous carbon film exhibits further high adhesion with the layer provided on the amorphous carbon film and comprising a material condensation-reacting with hydroxyl groups on the surface of the amorphous carbon film.

The present invention has been accomplished on the basis of these findings. According to one aspect of the present invention, there is provided a method for fixation, onto a surface of a layer comprising an amorphous carbon film and provided on a base material, of a layer comprising a material condensation-reacting with hydroxyl groups on the surface of the amorphous carbon film. In one embodiment, Si and O are added into the layer comprising an amorphous carbon film to thereby improve the adhesion durability and the binding uniformity of the layer comprising a material condensation-reacting with hydroxyl groups.

According to one aspect of the present invention, the material condensation-reacting with hydroxyl groups is a water repellent or water repellent/oil repellent material. According to another aspect of the present invention, the material condensation-reacting with hydroxyl groups is a fluorine-based silane coupling agent. According to one aspect of the present invention, the layer comprising an amorphous carbon film is composed of two or more layers, and at least an uppermost layer of the two or more layers contains Si and O.

A laminate according to one aspect of the present invention comprises at least a base material, a layer comprising an amorphous carbon film and provided on the base material, and a layer comprising a material condensation-reacting with hydroxyl groups on a surface of the amorphous carbon film, these layers being provided in this order, wherein the layer comprising an amorphous carbon film contains Si and O.

Advantageous Effects of Invention

By the method according to one embodiment of the present invention, an amorphous carbon (which may be referred to as "a-C:H:Si:O" in this description) film containing Si and O has high holding power with a layer which is to be fixed thereon and comprises a material condensation-reacting with hydroxyl groups on the amorphous carbon film, and thus an a-C:H:Si:O film obtained in one embodiment of the present invention can be used as a stable primer layer. In addition, in the method according to one embodiment of the present invention, when a fluorine-based silane coupling agent is used as the material condensation-reacting with hydroxyl groups on the amorphous carbon film, it is possible to impart high functions such as water repellency/ oil repellency, abrasion resistance, chemical resistance, low friction properties and non-tackiness to the a-C:H:Si:O film. Further, even when the functions of the silane coupling agent lower, a layer containing a silane coupling agent can be formed again, and thus the a-C:H:Si:O film can be repeatedly used.

DESCRIPTION OF EMBODIMENTS

Figure 1:
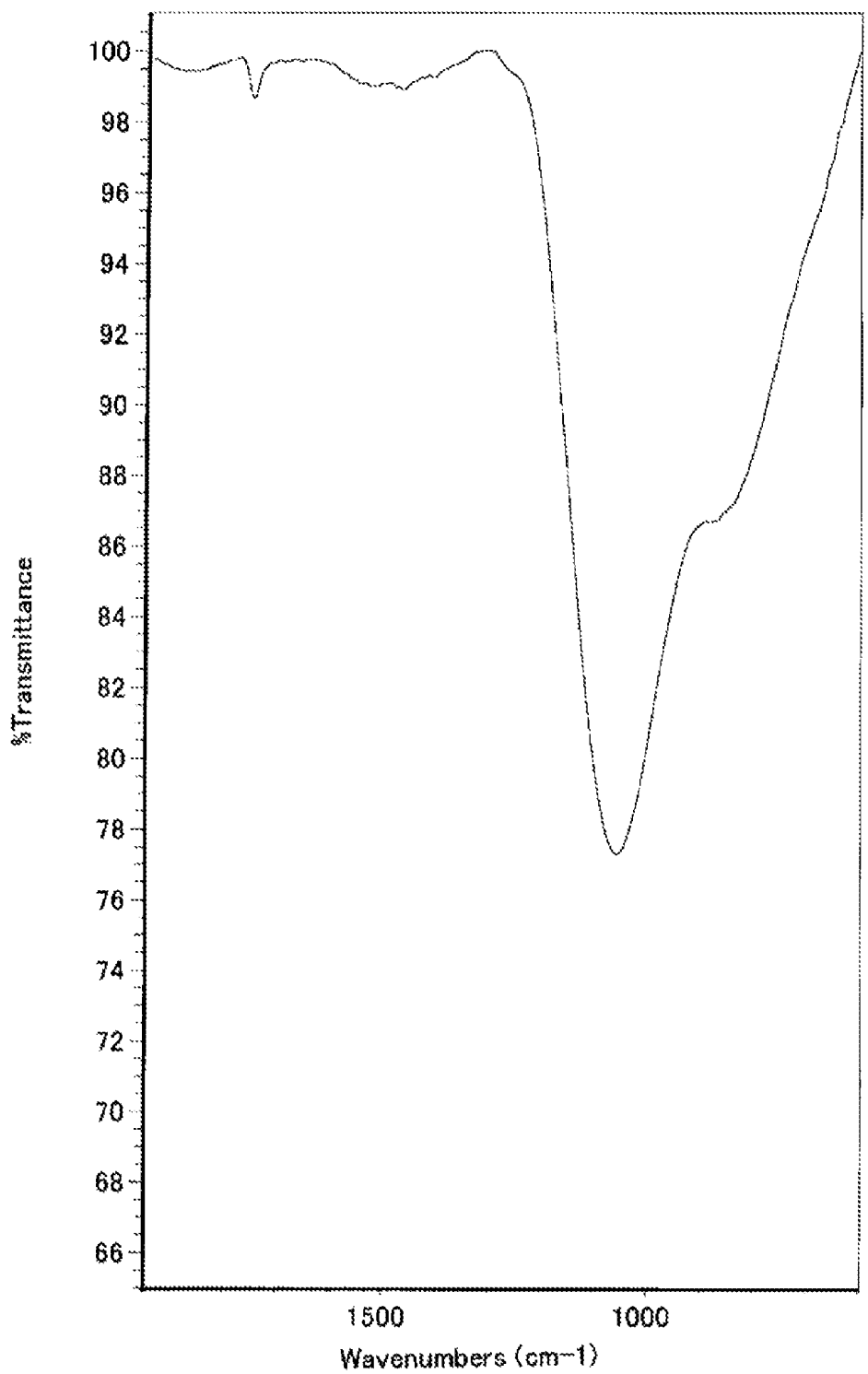
FIG. 1 is an FT-IR spectrum of the amorphous carbon film of Example 1.

The present invention is a method for fixation, onto a surface of a layer comprising an amorphous carbon film and provided on a base material, of a layer comprising a material condensation-reacting with hydroxyl groups on the surface of the film, wherein Si and O are added into the layer comprising an amorphous carbon film to thereby improve the adhesion durability and the binding uniformity of the layer comprising an material condensation-reacting with hydroxyl groups. In the amorphous carbon film provided on the base material, by adding Si and O into the amorphous carbon film, the adhesion power between the amorphous carbon film and the material condensation-reacting with hydroxyl groups on the amorphous carbon film is improved.

In the present invention, the material condensation-reacting with hydroxyl groups on the surface of the amorphous carbon film is a material having hydrolyzable groups such as a silanol group, or an alkoxy group such as an ethoxy group and a methoxy group, in which the hydrolyzable groups condense and react with hydroxyl groups on the surface of the amorphous carbon film to be bonded thereto. Specific examples of the silanol group include silane coupling agents, and specific examples of the alkoxy group include metal alkoxide. Especially, it is preferred that as the material condensation-reacting with hydroxyl groups on the surface of this amorphous carbon film, a fluorine-based silane coupling agent be used, because it is possible to impart high functions such as water repellency/oil repellency, abrasion resistance, chemical resistance, low friction properties and non-tackiness to the amorphous carbon film.

In the present invention, as the substrate, a variety of materials such as metal materials including iron, copper, and stainless steel (SUS); inorganic materials such as glass, silicon, and ceramics; and polymer materials such as polyethylene, polypropylene, and polystyrene, according to the intended use.

The amorphous carbon film (a-C:H film) of the present invention is formed directly or via another layer on the substrate, and in the present invention, Si and O is added to the amorphous carbon film. That is, the a-C:H:Si:O film of the present invention contains carbon (C), hydrogen (H), silicon (Si) and oxygen (O) as primary components. The Si content in the film is 4 to 50 atomic %, and preferably, 10 to 40 atomic %. In addition, the amount of oxygen (O) to be mixed in the primary base material hydrocarbon-based gas containing Si in the production of the amorphous carbon film is controlled so that the flow rate proportion of oxygen in the total flow rate of the primary base material gas containing Si in addition to oxygen is 0.01% to 12%. In one embodiment, taking into consideration that the mixing of oxygen and a combustible gas could cause an explosion, the flow rate proportion of oxygen is set to be less than the explosion limit amount in view of safety factor of the whole of the device. Such a flow rate proportion of oxygen in view of the safety factor is 12% or less, for example. In one embodiment, the flow rate proportion of oxygen is 0.5 to 10%. In another embodiment, the flow rate proportion of oxygen is 0.1 to 12%. In addition, the film thickness of the a-C:H:Si:O film of the present invention is not particularly limited, however, it is preferably at least 1 nm to 50 μm, and more preferably 5 nm to 3 μm.

In one embodiment of the present invention, in order to produce an a-C:H:Si:O film, it is possible to use the plasma CVD method which is a method of forming a film using a reactive gas. When the plasma CVD method is used, ions generated with plasma can be injected into a substrate by directly applying a voltage to a work to be film-formed. Oxygen ions obtained by plasma-forming the reactive gas can enter not only into the surface of the substrate but also even into the inside of the substrate and form a uniform Si—O bond on at least the surface layer of the amorphous carbon film. In one embodiment of the present invention, oxygen can be made to enter not only into the surface layer of the amorphous carbon film but also into the amorphous carbon film by plasma irradiation.

For example, in the plasma CVD method, by irradiating the surface of an already formed amorphous carbon film containing silicon, without mixing an oxygen gas with other base material gases, a large amount of oxygen can be injected to the inside of the amorphous carbon film while avoiding danger of explosion. Also, in a step sequentially performed to a film forming step using an organic silane-based base material gas such as trimethyl silane, by introducing a gas using only an oxygen gas and irradiating the amorphous carbon film with plasma, both of the steps can be carried out without causing vacuum breaks, and the productivity is improved. Further, by using a gas in which an oxygen gas is mixed at a predetermined proportion with an organic silane-based base material gas such as trimethyl silane, and performing film formation by the plasma CVD method, it is also possible to produce an a-C:H:Si:O film in the same batch process at a time.

According to one embodiment of the present invention, by irradiating the surface layer of an amorphous carbon film containing silicon with ionized or radicalized oxygen or by adding the ionized or radicalized oxygen thereinto, the silicon in the amorphous carbon film easily forms an Si—O bond. With this, the bonding position of silicon and oxygen is specified by a regular Si—O matrix, and thus functional groups extended from the silicon evenly appear on the surface of the amorphous carbon film.

Hereinafter, typical a-C:H:Si:O film forming methods using the plasma CVD method, of the present invention, will be described, however, the present invention is not limited to these methods.

(a) A method in which a gas containing oxygen is concurrently mixed with tetramethyl silane, methyl silane, dimethyl silane, trimethyl silane, dimethoxy dimethyl silane, tetramethyl cyclotetrasiloxane and the like.

(b) A method in which an amorphous carbon film containing silicon is formed with the use of a hydrocarbon-based plasma base material gas containing silicon, such as tetramethyl silane, methyl silane, dimethyl silane, trimethyl silane, dimethoxy dimethyl silane, and tetramethyl cyclotetrasiloxane, and then the surface of the amorphous carbon film is irradiated with oxygen or plasma formed with only a gas containing oxygen.

(c) A method in which a gas having an Si—O bond in molecules such as hexamethyldisiloxane and siloxane is concurrently mixed with a hydrocarbon-based gas containing no Si, such as acetylene.

In addition, examples of the plasma CVD method used in the production of the a-C:H:Si:O film of the present invention include a high-frequency plasma CVD method using a high-frequency discharge, a direct current plasma CVD method utilizing a direct current discharge, a microwave plasma CVD method utilizing a microwave discharge, and a high-pressure DC pulse plasma CVD method. Whatever the case may be, any of these methods may be used as long as a plasma device using a gas as a base material is used. In the high-pressure DC pulse plasma CVD method, a high voltage to the extent of −15 kV can be directly applied to the base material forming the film, and by a great inclination of electrolysis generated by a great voltage difference from the ground, generated plasma ions can be deposited on and injected into the base material with high energy and high acceleration.

Note that conditions for the temperature of the base material, the gas concentration, pressure, time and the like during the film formation are appropriately set in accordance with the composition and the film thickness of an a-C:H:Si:O film to be produced.

In the present invention, on an a-C:H:Si:O film formed by the above-mentioned method, a layer comprising a material condensation-reacting with hydroxyl groups on the surface of the film (hereinbelow, may be referred to as "material such as a silane coupling agent" or "silane coupling agent" acting on behalf of the material) is formed. As the method of forming the film, a method of applying a solution containing a material such as a silane coupling agent, a method of dipping the film in a solution containing a material such as a silane coupling agent and then drying the solution, and a method of spraying a silane coupling agent onto the film are used.

The layer comprising a silane coupling agent that has been dried is strongly fixed onto the surface of an a-C:H:Si:O film of the present invention by the action of the adhesion power of the a-C:H:Si:O film. The film thickness of the layer comprising a silane coupling agent and fixed onto the a-C:H:Si:O film of the present invention is not particularly limited, and the film thickness is suitably decided depending on the silane coupling agent used or the material to be fixed (coupled) onto the a-C:H:Si:O film via the silane coupling agent, however, it is about 1 nm to 1 μm.

In the present invention, a preferably used silane coupling agent is not particularly limited, however, as the silane coupling agent, in particular, it is preferred to use a fluorine-based silane coupling agent, and in this case, high functions such as water repellency/oil repellency, chemical resistance, low friction properties and non-tackiness can be imparted to the a-C:H:Si:O film. The fluorine-based silane coupling agent is not particularly limited, however, specifically, Fluorosurf FG-5010Z130-0.2 from Fluoro Technology Co., Ltd. and the like can be used.

EXAMPLES

Hereinafter, the present invention will be described using Examples of the present invention and Comparative Examples (conventional examples), however, the present invention is not limited to these Examples. Note that in Examples, as a production device of an a-C:H:Si:O film, a high-pressure DC pulse plasma CVD device was used, and as a base material, a stainless steel SUS304 2B product that has been subjected to electrolytic composite polishing so as to have a surface roughness Ra of 0.02 μm, a size of 30 mm-square, and a sheet thickness of 0.5 mm was used.

Formation of Amorphous Carbon Film

Example 1

First, a base material formed of a stainless steel SUS304 was placed on a sample table provided on a device (not shown), next, a reaction container was sealed, and air inside the reaction container was exhausted to a degree of vacuum of $7 \times 10^{-4}$ Pa. Next, the base material was subjected to cleaning with an Ar gas plasma for 15 minutes under the conditions of an Ar gas flow rate of 15 SCCM, a gas pressure of 1.5 Pa, and an applied pressure of −4 kV. After this cleaning treatment, tetramethyl silane was introduced into the reaction container at a flow rate of 15 SCCM, while an oxygen gas being introduced thereinto at a flow rate of 0.7 SCCM so that the flow rate mixing ratio of the oxygen gas with tetramethylene silane was 4.5%, and film formation was performed under the conditions of the reaction container inside pressure of 1.5 Pa, an applied pressure of −4 Kv and the film formation time of 30 minutes. As a result, an a-C:H:Si:O film having a film thickness of about 0.2 μm was obtained. This obtained sample was regarded as a test sample of Example 1.

Example 2

After the base material was subjected to cleaning with an Ar gas plasma in the same manner as in Example 1, the flow rate of tetramethyl silane was changed to 15 SCCM and the flow rate of oxygen was changed to 1.4 SCCM so that the flow rate mixing ratio of tetramethylene silane and the oxygen gas was 8.5%, and film formation was performed under the same conditions, except for the above mentioned conditions, thereby obtaining an a-C:H:Si:O film having a film thickness of about 0.2 μm. This obtained sample was regarded as a test sample of Example 2.

Example 3

Also, after the base material was subjected to cleaning with an Ar gas plasma in the same manner as in Example 1, a gas containing only tetramethyl silane was introduced into the base material at a flow rate of 15 SCCM and film formation was performed for 30 minutes at a gas pressure of 1.5 Pa and an applied voltage of −4 Kv, and then irradiated with plasma for 3 minutes using an oxygen gas under the conditions of a flow rate of 15 SCCM, a gas pressure of 1.5 Pa, and an applied voltage of −4 Kv to produce a sample. This obtained sample was regarded as a test sample of Example 3. In the production of each of these Examples, these test samples were formed with a high-pressure DC pulse power source under the film formation conditions of a pulse frequency of 2 kHz and a pulse width of 50 μs. In addition, in Examples 1 and 2, in order to uniformly generate Si—O in the amorphous carbon film, the mixing ratio of the base material gas used during the film formation was set to be constant.

Comparative Example 1

Using a high-pressure DC pulse power source, the base material was subjected to cleaning with an Ar gas plasma for 15 minutes under the conditions of a pulse frequency of 2 kHz, an Ar gas flow rate of 15 SCCM, a gas pressure of 1.5 Pa and an applied voltage of −4 kV. Thereafter, tetramethyl silane was introduced into the reaction container at a flow rate of 15 SCCM and film formation was performed for 2 minutes at a reactive gas pressure of 1.5 Pa and an applied voltage of −4 Kv to thereby form an intermediate layer on the base material, then, acetylene was introduced into the reaction container at a flow rate of 15 SCCM and film formation was performed for 30 minutes at a gas pressure of 1.5 Pa and an applied voltage of −4 Kv to thereby form an uppermost layer, subsequently, the base material was subjected to plasma irradiation for 3 minutes with an oxygen gas at a flow rate of 15 SCCM, a gas pressure of 1.5 Pa, and an applied voltage of −4 Kv, thereby obtaining a sample of Comparative Example 1, which was regarded as a test sample of Comparative Example 1. In this way, the test sample of Comparative Example 1 has, on its surface, an amorphous carbon film containing no Si.

Comparative Example 2

Also, after the base material was subjected to cleaning with an Ar gas plasma for 15 minutes using a high-pressure DC pulse power source, under the conditions of a pulse frequency of 2 kHz, an Ar gas flow rate of 15 SCCM, a gas pressure of 1.5 Pa and an applied voltage of −4 kV, tetramethyl silane was introduced into the reaction container at a flow rate of 15 SCCM, and film formation was performed for 30 minutes at a reactive gas pressure of 1.5 Pa and an applied voltage of −4 Kv, thereby obtaining a sample of Comparative Example 2, which was regarded as a test sample of Comparative Example 2.

Any of these Comparative Examples were formed with a high-pressure DC pulse power source under the film formation conditions of a pulse frequency of 2 kHz and a pulse width of 50 μs.

Analysis by Fourier Transform Infrared Spectroscopy (FT-IR Analysis)

With respect to each of the test samples of Examples 1 to 3 and Comparative Example 2 produced as above, the molecular structure of each amorphous carbon film was estimated from the absorption spectrum by FT-IR analysis. These analysis results are shown in FIGS. 1 to 4, respectively. As the measurement condition, an analysis device, HYPERION 3000 manufactured by Bruker Inc. was used. As the analysis method, the analysis was performed by the microscopic ATR method, and the measurement results are based on 8 high sensitive reflection frequencies and the number of measuring times of 32.

Figure 2:
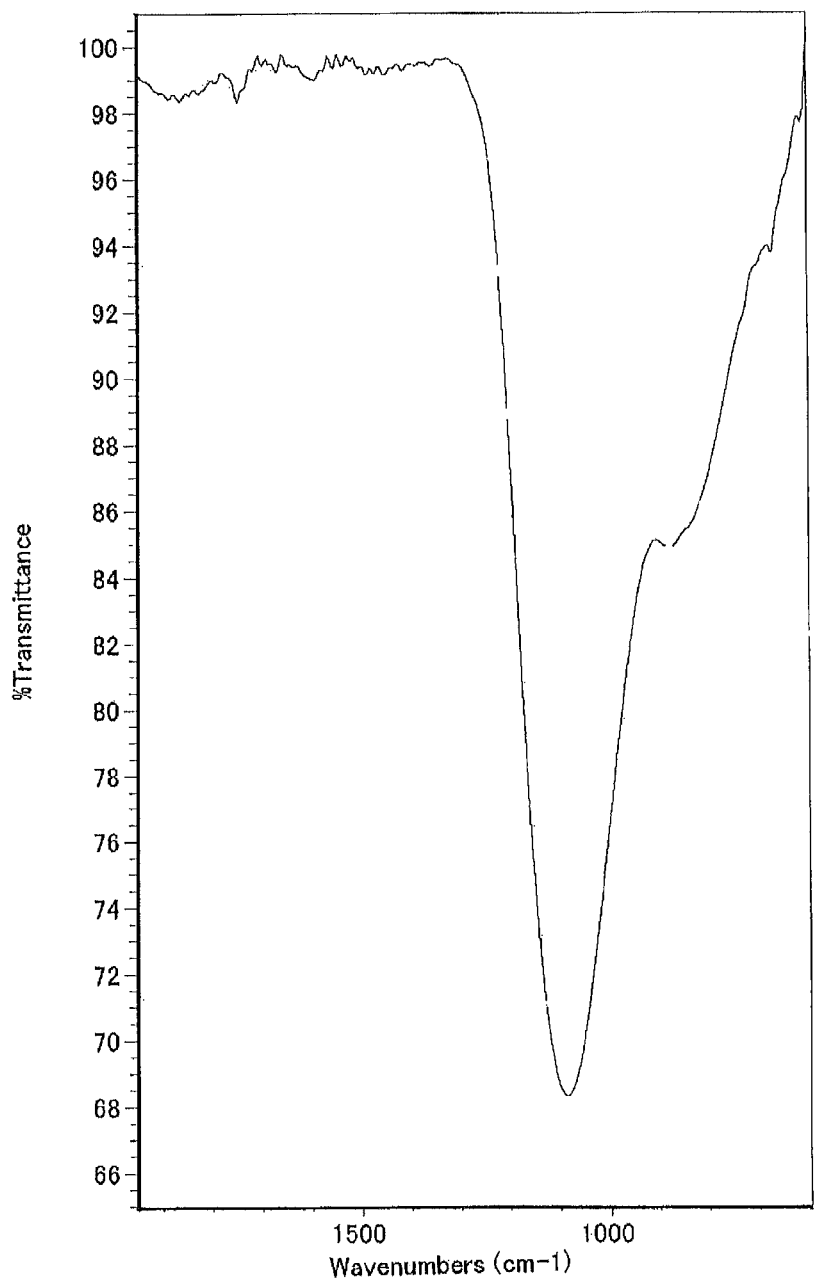
FIG. 2 is an FT-IR spectrum of the amorphous carbon film of Example 2.
Figure 3:
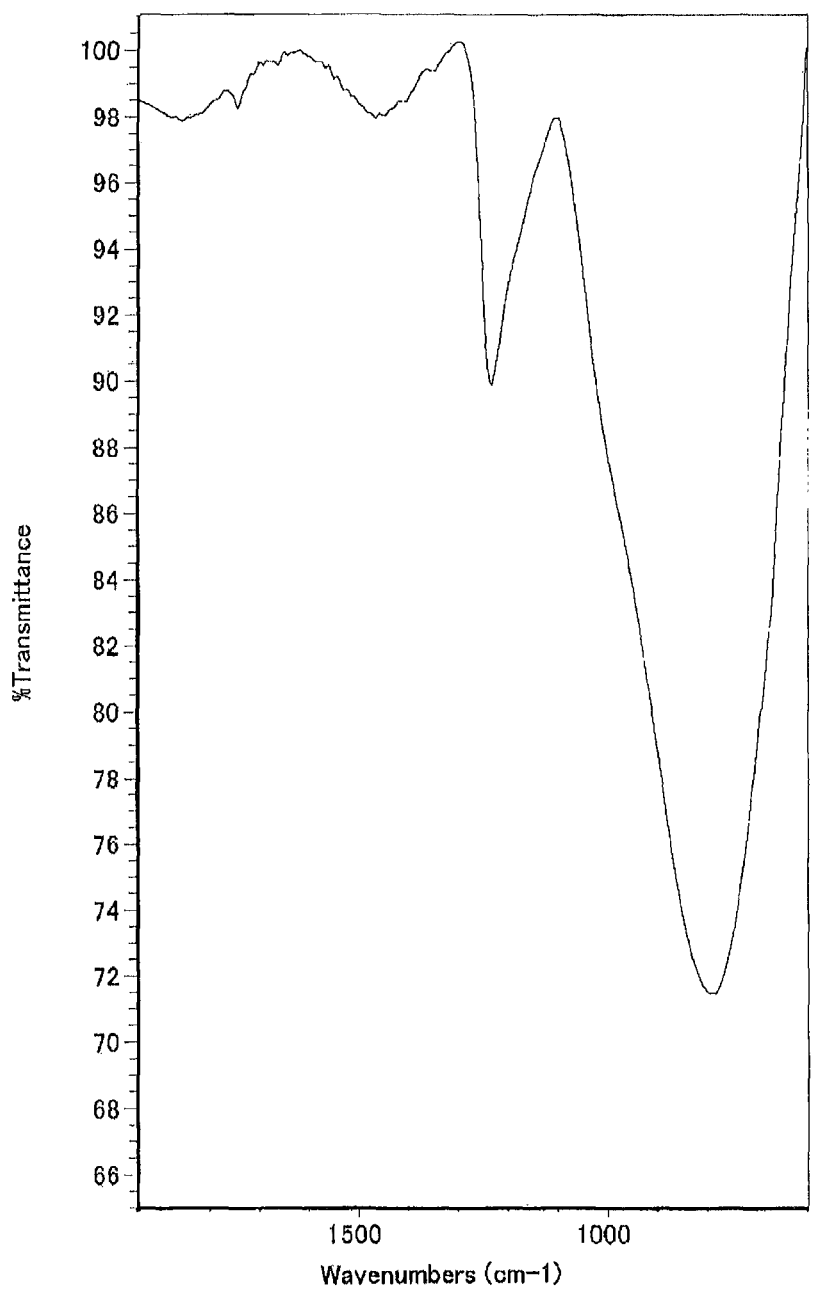
FIG. 3 is an FT-IR spectrum of the amorphous carbon film of Example 3.
Figure 4:
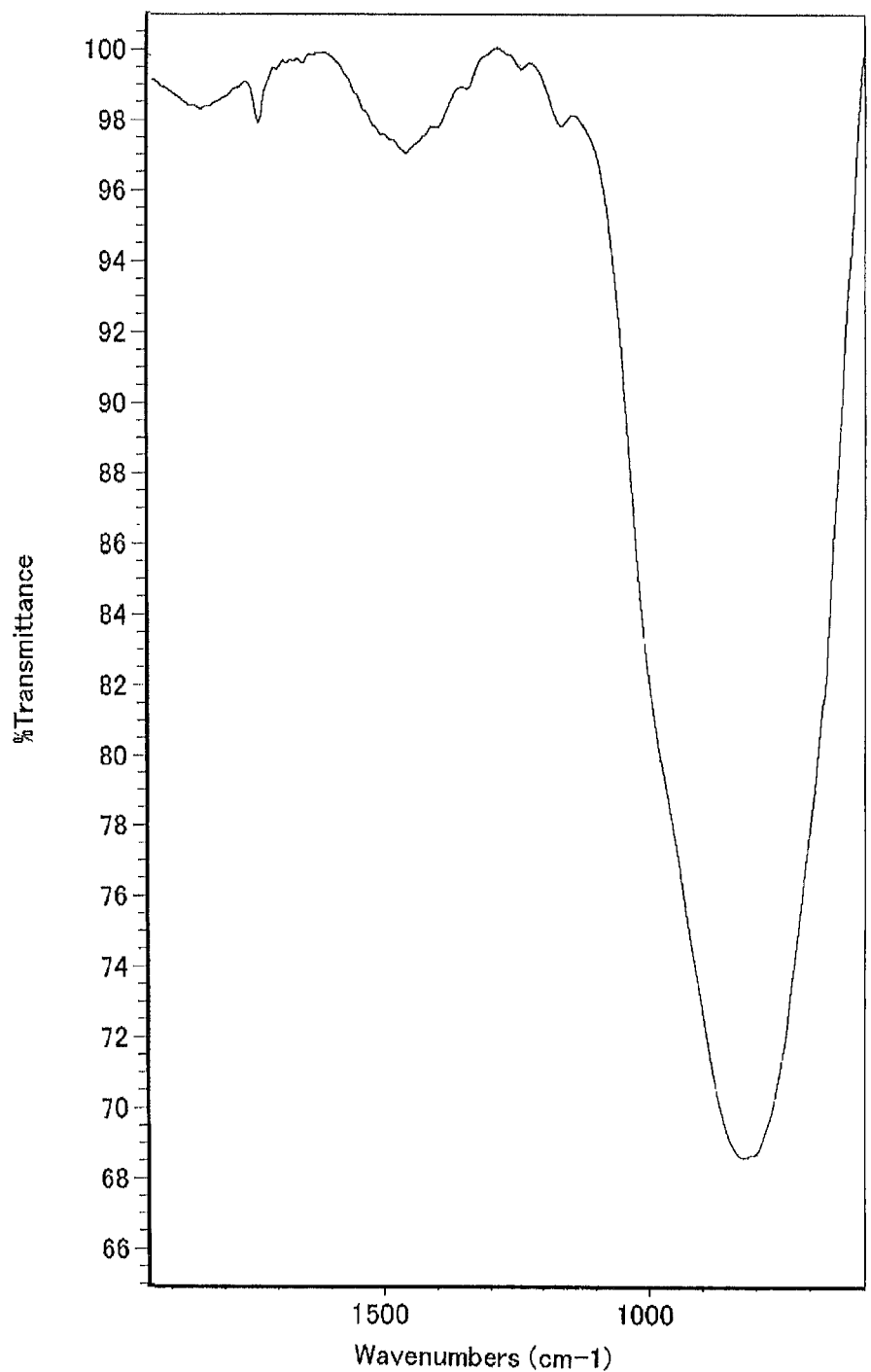
FIG. 4 is an FT-IR spectrum of the amorphous carbon film of Comparative Example 2.

Among these figures, in Example 1 shown in FIG. 1 and Example 2 shown in FIG. 2, Si—O bonds (siloxane bonds) are present near the wavenumbers of 1,050 to 1,100 (cm$^{-1}$). It turns out that Si—O bonds are more apparently and greatly detected than those in Comparative Example 2 shown in FIG. 4. It was confirmed that Example 2 having a large mixing amount of oxygen had high absorption within the above range of wavenumbers as compared to Example 1. Also, with respect to Example 3 shown in FIG. 3, it turns out, from peaks near 1,300 (cm$^{-1}$), that much more Si—O bonds were detected than those in Comparative Example 2.

From these results, it can be presumed that oxygen was introduced in the film or on the surface of the film. It can be considered that Si in the base material gas in the amorphous carbon film or Si near the surface layer of the amorphous carbon film has high reactivity with oxygen radicals, a network of Si—O—Si is formed in the vapor phase or during the film formation of the amorphous carbon film, and thereby oxygen is uniformly introduced into the amorphous carbon film. In addition, it can also be presumed that when precursors of $SiO_2$ in the vapor phase are adsorbed onto the surface of the amorphous carbon film, a network of Si—O is formed.

With respect to Comparative Example 2 in which the same base material gas was used and oxygen was not introduced through plasma irradiation, the absorption was hardly confirmed within the same range. Besides, although it is not shown in the figures, it was confirmed that the test samples of Examples 1 to 3 had higher adsorption of bonded OH groups that could be recognized near the wavenumbers of 3,600 to 3,300 (cm$^{-1}$) than that of Comparative Example 2, and more bonded OH groups were formed. It can be considered that these groups become hydroxyl groups on an amorphous carbon film and contribute to binding of the material condensation-reacting with hydroxyl groups.

Formation of Layer Comprising Silane Coupling Agent

Thereafter, each of the test samples formed as described above was dipped in and coated with a solution (fluororesin: 0.02 to 0.2%, fluorine-based solvent: 99.8% to 99.98%) of Fluorosurf FG-5010Z130-0.2 being a fluorine-based silane coupling agent, from Fluoro Technology Co., Ltd., and dried at room temperature for 2 days.

The silane coupling agent is a silane-based compound, and generally, is a compound in which perfluorooctylethyl trimethoxysilane, perfluorooctylethyl tripropoxysilane, perfluorooctylethyl triaminosilane, perfluorooctylethyl trichlorosilane or the like is dissolved in a solvent selected from the group consisting of fluorine-based alcohols such as isopropyl alcohol, acetone, hydrofluoroether, perfluoropolyether, hydrofluorocarbon, perfluorocarbon and hydrofluoropolyether.

Measurement of Contact Angle

Each of the test samples was subjected to ultrasonic wave washing in acetone; and contact angles of water were measured after 5 minutes and after 8 hours (at the time of a continuous ultrasonic wave washing for 1 hour, the washing was stopped on a temporary basis and left standing for 60 minutes, and this process was repeated 8 times while preventing an increase in the temperature of acetone, taking 8 hours in total), and thereby a comparison test for examining the fixability of the fluorine-based silane coupling agent was performed. Note that the measurement of each contact angle was performed using a mobile type contact angle measurement device PG-X manufactured by Fibro system AB under the environment of a temperature of 25° C. and a humidity of 30%. Water used in the measurement of contact angles was pure water. As an ultrasonic wave washer, US-20KS manufactured by SND Co., Ltd., oscillation 38 kHz (BLT self-oscillation), high frequency output 480 W was used. In ultrasonic wave washing, strong vibrations were locally generated by vibrations from a piezoelectric vibrator to generate cavities in acetone. Since when the cavities crush on the surface of the base material, the crushed cavities generate a great physical impact force to the surface of the base material, it is convenient and suitable to check the adhesion power and the like in the case where a second layer and the like are brought into adhesion with the base material.

Figure 5:
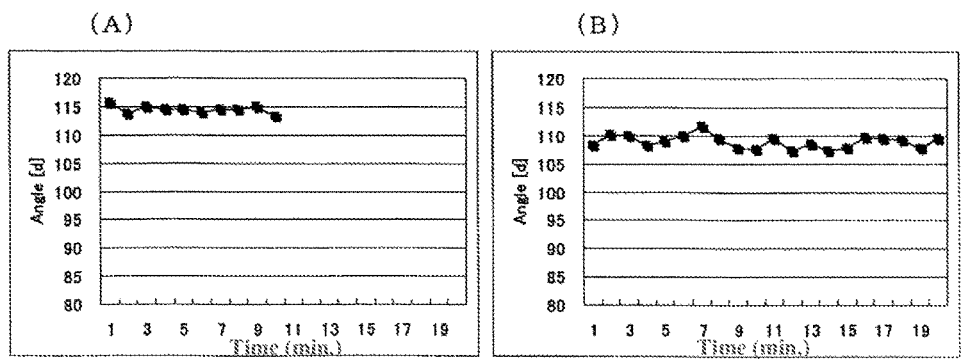
FIG. 5 is a view showing measurement results of a contact angle (A) obtained 5 minutes after and a contact angle (B) obtained 8 hours after ultrasonic wave washing of a sample in which a layer comprising fluorine-based silane coupling agent is formed on the amorphous carbon film of Example 1.
Figure 6:
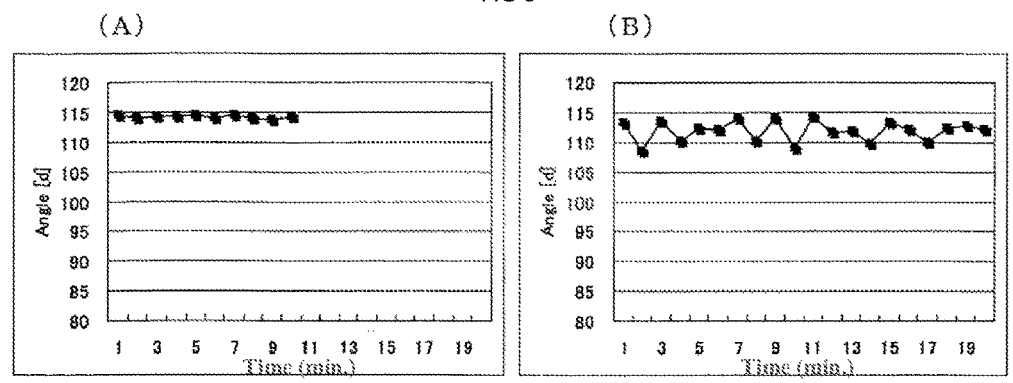
FIG. 6 is a view showing measurement results of a contact angle (A) obtained 5 minutes after and a contact angle (B) obtained 8 hours after ultrasonic wave washing of a sample in which a layer comprising a fluorine-based silane coupling agent is formed on the amorphous carbon film of Example 2.
Figure 7:
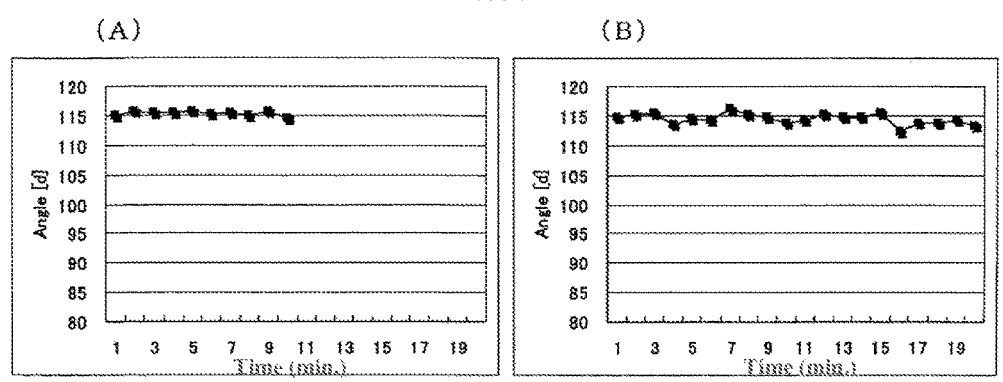
FIG. 7 is a view showing measurement results of a contact angle (A) obtained 5 minutes after and a contact angle (B) obtained 8 hours after ultrasonic wave washing of a sample in which a layer comprising a fluorine-based silane coupling agent is formed on the amorphous carbon film of Example 3.
Figure 8:
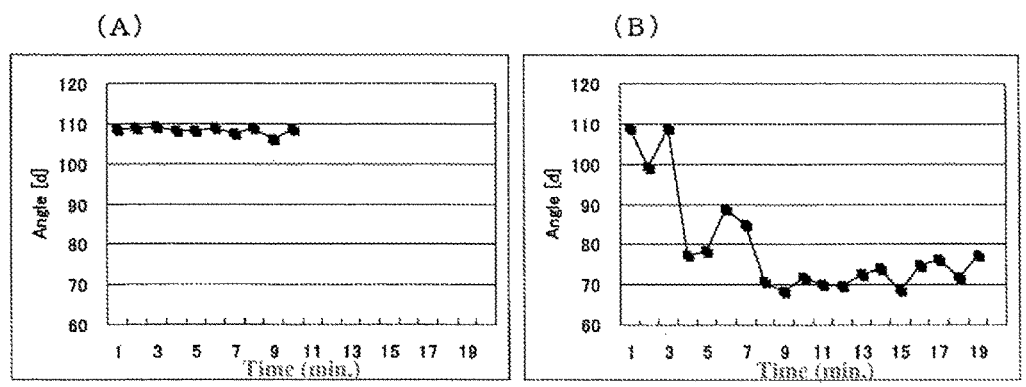
FIG. 8 is a view showing measurement results of a contact angle (A) obtained 5 minutes after and a contact angle (B) obtained 8 hours after ultrasonic wave washing of a sample in which a layer comprising a fluorine-based silane coupling agent is formed on the amorphous carbon film of Comparative Example 1.
Figure 9:
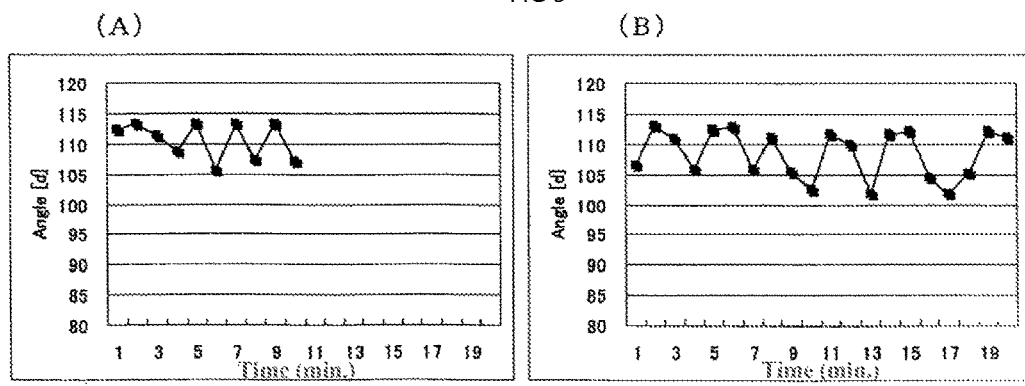
FIG. 9 is a view showing measurement results of a contact angle (A) obtained 5 minutes after and a contact angle (B) obtained 8 hours after ultrasonic wave washing of a sample in which a layer comprising a fluorine-based silane coupling agent is formed on the amorphous carbon film of Comparative Example 2.

Contact angles of each of the test samples after being subjected to ultrasonic wave washing are shown in FIGS. 5 to 9, respectively. FIG. 5 shows the measurement results of the test sample of Example 1, FIG. 6 shows the measurement results of the test sample of Example 2, FIG. 7 the measurement, results of the test sample of Example 3, FIG. 8 shows the measurement results of the test sample of Comparative Example 1, and FIG. 9 shows the measurement results of the test sample of Comparative Example 2. In each of these figures, graphs (A) show the results measured after the ultrasonic wave washing was performed for 5 minutes. Graphs (B) show the results measured after the ultrasonic wave washing was performed for 8 hours. In each of these figures, the abscissa axis shows the number for indentifying the measurement position on each of the test samples, and the ordinate axis shows the measured values of contact angles. Note that with respect to FIG. 8 showing the results of Comparative Example 1, the graph (B) shows the results of contact angles measured after the ultrasonic wave washing was performed for 1 hour, being shorter than 8 hours.

Just for reference, the relationship between a contact angle with water of a fluorine material which is the most excellent in water repellency and a contact energy with water, and the relationship between a contact angle with water of a silicone material which is excellent in water repellency next to the fluorine material and a contact energy with water are shown in the following Table.

TABLE 1

| | |
|---|---|
| #1 | Material |
| #2 | Contact angle with water |
| #3 | Contact energy with water |
| #4 | Fluororesin |
| #5 | 115 (degrees) |
| #6 | Silicone resin |
| #7 | 100 (degrees) |

Contact Angle of Example 1

As shown in FIG. 5, in the test sample of Example 1, the contact angle measured after the ultrasonic wave washing was performed for 5 minutes was 115 degrees, contact angles near that of fluororesin were measured at any positions in a stable manner, and the variability on a measured position basis was also small. Also, in the measurement after the ultrasonic wave washing was performed for 8 houses, a decrease in contact angle of 5 degrees to 7 degrees or so was observed, however, the variability on a measured position basis was small. From this, in the test sample obtained in Example 1, it was confirmed that the amorphous carbon film containing Si and O is excellent in fixability of the fluorine-based silane coupling agent and exhibits uniform water repellent function at any points of the surface thereof.

Contact Angle of Example 2

As shown in FIG. 6, in the test sample of Example 2, the contact angle measured after the ultrasonic wave washing was performed for 5 minutes was 115 degrees, contact angles near that of fluororesin were measured at any positions in a stable manner, and the variability on a measured position basis was also small. Also, in the measurement after the ultrasonic wave washing was performed for 8 houses, a decrease in contact angle of 5 degrees or so was observed, however, the variability on a measured position basis was small. From this, in the test sample obtained in Example 2, it can be confirmed that the amorphous carbon film containing Si and O is excellent in fixability of the fluorine-based silane coupling agent and exhibits uniform water repellent function at any points of the surface thereof.

Contact Angle of Example 3

As shown in FIG. 7, in the test sample of Example 3, the contact angle measured after the ultrasonic wave washing was performed for 5 minutes was 115 degrees, contact angles near that of fluororesin were measured at any positions in a stable manner, and the variability on a measured position basis was also small. Even in the measurement after the ultrasonic wave washing was performed for 8 houses, a decrease in contact angle from 115 degrees at the initial stage was not observed. From this, in the test sample obtained in Example 3, it can be confirmed that the amorphous carbon film containing Si and O is excellent in fixability of the fluorine-based silane coupling agent and exhibits uniform water repellent function at any points of the surface thereof.

Contact Angle of Comparative Example 1

As shown in FIG. 8, in the test sample of Comparative Example 1, the contact angle measured after the ultrasonic wave washing was performed for 5 minutes was 110 degrees, and the measured values of contact angle after the ultrasonic wave washing was performed for 1 hour significantly lowered. In the test sample of Comparative Example 1, it can be considered that after the ultrasonic wave washing was performed for 1 hour, a large amount of fluorine drained away from the surface of the amorphous carbon film. From this, it turns out that the amorphous carbon film containing no Si of Comparative Example 1 is inferior in fixability of the fluorine-based silane coupling agent, as compared to the amorphous carbon films containing Si and O of the test samples of Examples 1 to 3.

Contact Angle of Comparative Example 2

As shown in FIG. 9, in the test sample of Comparative Example 2, at the point after the ultrasonic wave washing was performed for 5 minutes, there were already some points of measured positions where contact angles near 105 degrees were measured. The contact angle of 105 degrees is near the contact angle of a silicone resin, which is lower than that of fluorine. In addition, the range of variability on a measured position basis is also already wide, from about 114 degrees to 105 degrees, as compared to that of Example 3. From this, in the test sample of Comparative Example 2, it can be presumed that the fluorine-based silane coupling agent was unevenly distributed. Also, at the measurement point after the ultrasonic wave washing was performed for 8 hours, some points where contact angles lowered to 100 degrees, being as low as that of silicone resin, were recognized. In addition, there were many points where contact angles lowered to about 105 degrees. In this way, from the measurement results obtained after the ultrasonic wave washing was performed for 8 hours, it turns out that the contact angles further lowered as a whole, and the variability on a measured position basis widened. From this, it can be confirmed that the amorphous carbon film containing no O in the test sample of Comparative Example 2 has unevenness in the fixed state of fluorine and is inferior in fixability and water repellency expressed state, as compared to the test samples of Examples 1 to 3. In the amorphous carbon film containing no oxygen of Comparative Example 2, the water repellency equivalent to that of a silicone material can be only obtained from the fluorine-based silane coupling agent.

Subsequently, the adhesion durability of a coupling agent film in a laminate produced according to an embodiment of the present invention was examined. First, 6 sheets of planar dies formed of stainless steel SUS304 of 100 mm×100 mm in size and having a surface roughness Ra of 0.075 μm were prepared. Subsequently, these 6 dies were washed for 15 minutes using an ultrasonic wave washer into which IPA (isopropyl alcohol) being a washing liquid had been charged. Next, the dies after being washed were put into a high-pressure DC micropulse plasma CVD device, and an amorphous carbon film was formed on one side surface of each of these dies.

The specific film formation method is as follows. First, 2 sheets of dies were placed in a high-pressure DC micropulse plasma CVD device, next, the reaction container was sealed, and air inside the reaction container was exhausted to a degree of vacuum of $7 \times 10^{-4}$ Pa. Next, the base material was subjected to cleaning with an Ar gas plasma at a flow rate of 30 SCCM for 10 minutes under the conditions of a gas pressure of 2 Pa, an applied pressure of −3 kV, a pulse frequency of 10 kHz, and a pulse width of 10 μs. Thereafter, tetramethyl silane was introduced into the reaction container at a flow rate of 30 SCCM, while an oxygen gas being introduced thereinto at a flow rate of 3 SCCM, and film formation was performed using this mixed gas for 12 minutes under the conditions of the reaction container inner pressure of 2 Pa, an applied pressure of −5 Kv, a pulse frequency of 10 kHz, and a pulse width of 10 μs. With this, a set of die samples having a-C:H:Si:O films on their surfaces were obtained. These obtained samples are regarded as samples of Examples 4-1 and 4-2.

Also, another set of dies was subjected to a cleaning treatment in the same manner as in Examples 4-1 and 4-2, and thereafter, a gas containing only tetramethyl silane (i.e., an oxygen gas was not contained therein) was introduced thereinto at a flow rate of 30 SCCM, and film formation was performed for 12 minutes under the conditions of a gas pressure of 2 Pa, an applied voltage of −5 Kv, a pulse frequency of 10 kHz, and a pulse width of 10 μs. Thereafter, the dies were irradiated with an oxygen plasma for 2 minutes using an oxygen gas under the conditions of a flow rate of 30 SCCM, a gas pressure of 2 Pa, an applied voltage of −5 Kv, a pulse frequency of 10 kHz, and a pulse width of 10 μs. A set of die samples having a-C:H:Si:O films on their surfaces were obtained. These samples are regarded as samples of Examples 5-1 and 5-2.

In addition, a remaining set of dies was subjected to a cleaning treatment in the same manner as in Examples 4-1 and 4-2, and thereafter, tetramethyl silane was introduced into the reaction container at a flow rate of 30 SCCM, and film formation was performed for 12 minutes under the conditions of a reactive gas pressure of 2 Pa, an applied voltage of −5 Kv, a pulse frequency of 10 kHz and a pulse width of 10 μs, thereby obtaining a set of die samples in which a-C:H:Si:O films were not present on their surfaces. These samples are regarded as samples of Comparative Examples 3-1 and 3-2.

After completion of the film formation, each of the samples of Examples 4-1, 4-2, 5-1, 5-2, and Comparative Examples 3-1 and 3-2 was left standing in the atmosphere (temperature: 25° C., humidity: 30%) for 24 hours. Thereafter, each of the samples was dipped in and coated with a solution (fluororesin: 0.02 to 0.2%, fluorine-based solvent: 99.8% to 99.98%) of Fluorosurf FG-5010Z130-0.2 from Fluoro Technology Co., Ltd., and left standing for 90 minutes. After leaving the samples in the environment for 90 minutes, dip-coating was performed to each of the samples again. Then, the samples were naturally dried at room temperature for 20 hours. In this way, one side surface of each of the samples of Examples 4-1, 4-2, 5-1, 5-2, and Comparative Examples 3-1 and 3-2 was coated with fluorine to prepare test samples.

Next, in Examples 4-1 and 4-2; Examples 5-1 and 5-2, and Comparative Examples 3-1 and 3-2, individual test samples produced in each Example or each Comparative Example were made to be a pair, and respective film surfaces thereof were made to face each other. A ceramic green sheet was placed so as to be sandwiched between the opposed film surfaces. This ceramic green sheet was produced in the following step. First, a ceramic material powder primarily containing barium titanate, an organic binder such as PVB (polyvinyl butyral), and an organic solvent such as ethanol were mixed at a predetermined ratio to obtain a ceramic slurry. This slurry was formed into a sheet having a thickness of about 20 μm by a known sheet-forming method such as doctor blade method, and then cut into a predetermined size to produce a ceramic green sheet of 100 mm×100 mm in size. Fifty sheets of this green sheet were laminated, thereby obtaining a ceramic green sheet having a thickness of about 1 mm. The tacking strength of the surface of the sheet at that time was about 600 g/cm$^2$.

This ceramic green sheet was fixed to each of the test samples with a tape. In this way, with the ceramic green sheet being sandwiched between the opposed surfaces of the test samples, each of the test samples were put into a resin-made pack, and air inside the pack was exhausted. Next, this resin-made pack was thermally sealed, the thermally sealed resin-made pack was charged into a hydrostatic pressure pressing device and pressed in a step-by-step manner under the conditions of the maximum pressure of 150 Mpa and the maximum pressure holding time of 15 minutes. With setting a profile where the pressure is reduced in a step-by-step manner after the maximum pressure holding time, and the heating temperature is maintained at 150° C., as one cycle, the number of pressing times at which the ceramic sheet could not be naturally peeled off from the surface of the die was checked. Together with this, on every 5 pressing times, at 4 points in total of a center portion in the vicinity of an end of one side of the surface of each die, another center portion in the vicinity of an end of one side adjacent to the one side of the surface, and both corners thereof, contact angles with water were measured.

Figure 10:
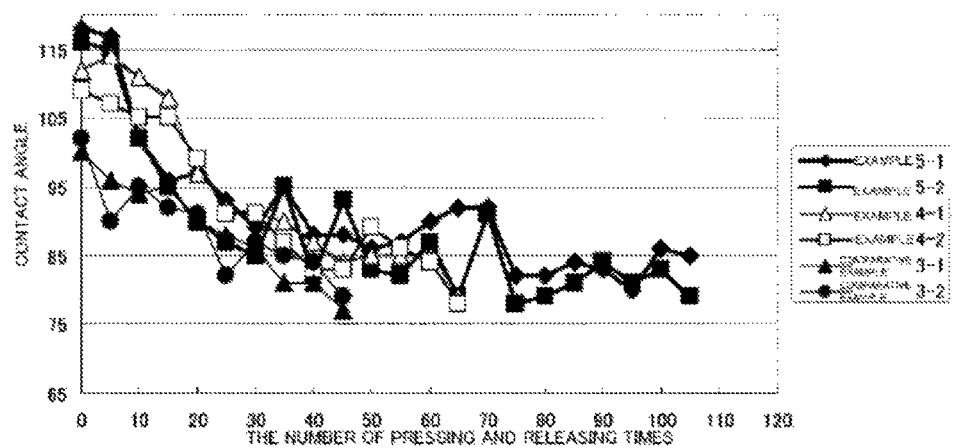
FIG. 10 is a view showing relationships between the number of pressing times and the average value of contact angles of individual test samples of Examples and Comparative Examples.

FIG. 10 is a graph showing the relationships between the number of pressing times and the average value of measured values of contact angles. In the same figure, the abscissa axis shows the number of pressing times, and the ordinate axis shows the average value of contact angles with water on the surface of each of the samples. The average value of contact angles is a value in which 4 points in total of a center portion in the vicinity of an end of one side of the surface of each test sample, another center portion in the vicinity of an end of one side adjacent to the one side of the surface, and both corners thereof were measured as described above, and the measured values are averaged. In the measurement of the contact angles, a mobile type contact angle measurement device PG-X manufactured by Fibro system AB was used. As water for measuring the contact angles, pure water was used, and the measurement was performed under the environment of a temperature of 25° C. and a humidity of 30%.

As shown in FIG. 10, at the time when the samples had not yet been pressed, the test sample of Example 4-1 (-△-), the test sample of Example 4-2 (-□-), the test sample of Example 5-1 (-♦-) and the test sample of Example 5-2 (-■-) had large contact angles, as compared to contact angles of the test sample of Comparative Example 3-1 (-▲-) and the test sample of Comparative Example 3-2 (-●-). The ceramic green sheet placed between the test samples of Comparative Examples 3-1 and 3-2 could not be peeled off from the die after 45 pressing times of the samples. The ceramic green sheet placed between the test samples of Examples 4-1 and 4-2 could not been peeled off from the die after 65 pressing times of the test samples. The ceramic green sheet placed between the test samples of Example 5-1 and 5-2 could not be peeled off from the die after 107 pressing times of the test samples. The main contributory factor that prevents the ceramic sheet from being peeled off is because of dropping-off of a fluorine coating from the surface of each sample, leading to adhesion of the ceramic green sheet to the amorphous carbon film. Thus, it was confirmed that as compared to the test samples of Comparative Examples 3-1 and 3-2, in the test samples of Example 4-1 and 4-2, and Example 5-1 and 5-2, the holding power between the amorphous carbon film and the layer formed on the amorphous carbon film and comprising a material condensation-reacting with hydroxyl groups on the amorphous carbon film was improved.

The test samples of Examples 4-1 and 4-2 in which the ceramic green sheet could not been peeled off from the die at 65 pressing times, and the test samples of Examples 5-1 and 5-2 in which the ceramic green sheet could not been peeled off from the die at 107 pressing times, both of which had been subjected to the testing, were subjected to coating again as follows.

First the test samples of Examples 4-1 and 4-2 that could not been peeled off and the test samples of Examples 5-1 and 5-2 that could not been peeled off were subjected to ultrasonic wave washing for 15 minutes in a washer into which IPA (isopropyl alcohol) had been charged. After that washing, the test samples were left standing in the atmosphere (temperature: 25° C., humidity: 30%) for 24 hours. Thereafter, each of the samples was dipped in and coated with a solution (fluororesin: 0.02 to 0.2%, fluorine-based solvent: 99.8% to 99.98%) of Fluorosurf FG-5010Z130-0.2 from Fluoro Technology Co., Ltd. After leaving the samples in the environment for 90 minutes, dip-coating was performed to each of the samples again, and then, the samples were naturally dried at room temperature for 20 hours. Then, the naturally dried test samples of Examples 4-1 and 4-2 and Examples 5-1 and 5-2 were subjected to washing for 10 minutes in an ultrasonic wave washer into which IPA (isopropyl alcohol) had been charged. In this way, contact angles with water of the reproduced test samples of Examples 4-1 and 4-2 and Examples 5-1 and 5-2 that had been re-coated with fluorine were measured in the same manner as described above. As a result, the contact angle of Example 4-1 was 111°, the contact angle of the reproduced test sample of Example 4-2 was 109°, the contact angle of the reproduced test sample of Example 5-1 was 118°, and the contact angle of the reproduced test sample of Example 5-2 was 116°. With this, it was confirmed that the fluorine-based silane coupling material was bonded again to each amorphous carbon film of the reproduced test samples of Examples 4-1 and 4-2 and the reproduced test samples of Examples 5-1 and 5-2.

In this way, in Examples of the present invention, it is conceivable that even when the binding of the surface of the amorphous carbon film with the silane coupling agent is temporarily impaired, the binding of the surface of the amorphous carbon film and the re-applied silane coupling agent is made strong because Si—O bonds that are uniformly distributed inside the amorphous carbon film are exposed to the surface thereof.

According to each embodiment of the present invention, it is presumed that from the FT-IR spectra shown in FIGS. 1 to 4, bonds of Si—O are formed regularly in each of the amorphous carbon films. With such regular Si—O bonds being introduced into each of the amorphous carbon films, the arrangement of hydroxyl groups formed on the amorphous carbon film can be made uniform. Then, with the arrangement of hydroxyl groups being made uniform, the silane coupling agent can be uniformly distributed on the surface of the amorphous carbon film. That is, it is possible to resolve uneven distribution of bonding positions of the silane coupling agent.

Also, although it is not shown in the figures, in the described embodiments (Examples 1-3), the measurement was performed with an analyzer PROTEGE 460 manufactured by Nicolet Instrument Corporation by the microscopic ATR method, and in the measurement results with the number of integration times of 128, HO bonds (OH bonds (—OH)) were recognized near the wavenumbers of 3,600 to 3,300 (cm$^{-1}$). From this result, it can be presumed that the amount of the silane coupling agent fixed onto the surface of the amorphous carbon film increased, and this contributed to the widening of the contact angles.

The fixation methods and laminates described in this description are illustrated by examples, and various modifications may be accomplished to the structures, materials and production methods without departing from the scope of the present invention. Besides, various modifications may be accomplished to the above-mentioned embodiments and Examples without departing from the scope of the present invention.

The invention claimed is:

1. A laminate comprising:
a base material;
an amorphous carbon film formed on the base material, the amorphous carbon film comprising silicon and oxygen on a surface thereof and inside thereof, and hydroxyl groups on a surface thereof, wherein the amorphous carbon film contains Si—O bonds; and
a coupling agent film positioned on a top surface of the amorphous carbon film and configured to condensation-react with the hydroxyl groups on the surface of the amorphous carbon film,
wherein the amorphous carbon film has a higher concentration of oxygen in a first region adjacent to the top surface than in a second region adjacent to a bottom surface of the amorphous carbon film opposite to the top surface;
wherein the amorphous carbon film exhibits a peak of the Si—O bonds in a region between wavenumbers of 1200-1300 cm$^{-1}$ through Fourier transform infrared spectroscopy (FT-IR).

2. The laminate according to claim 1, wherein the coupling agent film is configured to condensation-react by comprising a water repellent material or a water repellent/oil repellent material.

3. The laminate according to claim 1, wherein the coupling agent film is configured to condensation-react by comprising a fluorine-based silane coupling agent.

4. The laminate according to claim 1, wherein the layer comprising an amorphous carbon film is composed of two or more layers, and Si and O are added into an uppermost layer of the two or more layers.

5. The laminate according to claim 1, wherein the amorphous carbon film contains oxygen at a uniform concentration across the region adjacent to the top surface.

6. The laminate according to claim 1, wherein the amorphous carbon film is positioned directly on the base material.

* * * * *